United States Patent [19]

Kakinuma et al.

[11] Patent Number: 4,811,069
[45] Date of Patent: Mar. 7, 1989

[54] PHOTOELECTRIC CONVERSION DEVICE

[75] Inventors: Hiroaki Kakinuma; Yukio Kasuya; Masaaki Sakamoto; Tsukasa Watanabe, all of Tokyo, Japan

[73] Assignee: Oki Electric Industry Co., Ltd., Tokyo, Japan

[21] Appl. No.: 157,725

[22] Filed: Feb. 22, 1988

[30] Foreign Application Priority Data

Feb. 23, 1987 [JP] Japan .................... 62-37771

[51] Int. Cl.[4] ............... H01L 27/12; H01L 29/48; H01L 27/14; H01L 29/04
[52] U.S. Cl. ......................... 357/30; 357/4; 357/59; 357/15
[58] Field of Search ........... 357/4, 30 A, 30 C, 30 K, 357/59 A, 59 C, 59 D, 15

[56] References Cited

U.S. PATENT DOCUMENTS 4,419,696 12/1983 Hamano et al. ............. 357/30
4,523,214 6/1985 Hirose et al. ............... 357/59 C

FOREIGN PATENT DOCUMENTS 6074569 4/1985 Japan ................... 357/30 K

OTHER PUBLICATIONS

IEEE Transactions on Components, Hybrids and Manufacturing Tech. vol. CHMT-7 No. 4, 12/84, "High Speed and High Resolution . . . Photodetector Array" K. Suzuki et al., pp. 423-428.

Primary Examiner—Andrew J. James
Assistant Examiner—Donald J. Featherstone
Attorney, Agent, or Firm—Wenderoth, Lind & Ponack

[57] ABSTRACT

A photoelectric conversion device comprises a photodiode comprising a metallic electrode formed of a metal capable of forming a Schottky junction together with amorphous silicon, such as Cr or Ni, a transparent electrode formed of ITO or the like, and an i-type hydrogenated amorphous silicon layer sandwiched in between the metallic electrode and the transparent electrode. A bias voltage is applied across the metallic electrode and the transparent electrode so that the metallic electrode is biased to a negative potential relative to the transparent electrode. A Schottky barrier formed in the interface between the metallic electrode and the i-type hydrogenated amorphous silicon layer is used as an electron blocking layer. Thus, the dark current is suppressed on a low level and the photoelectric conversion device is able to operate at a high S/N ratio.

7 Claims, 9 Drawing Sheets

PHOTOELECTRIC CONVERSION DEVICE

BACKGROUND OF THE INVENTION

1. Field of the Invention

The present invention relates to a photoelectric conversion device and, more specifically, to a photoelectric conversion device comprising amorphous silicon photodiodes and suitable for application as an image sensor to a facsimile equipment or an image processing apparatus.

2. Description of the Prior Art

Zealous researches have been made in recent years to develop a photoelecric conversion device employing a photodiode array for use as an image reader for a facsimile equipment or an image processing apparatus. An amorphous silicon photodiode, for example, a photodiode using hydrogenated amorphous silicon (hereinafter referred to as "a-Si:H") is one of the photodiodes for such a device. Since a-Si:H photodiodes facilitate forming a large or long photodiode array, a-Si:H photodiodes are suitable for application to a contact type image sensor for isometric document reading. U.S. Pat. No. 4,419,696 and IEEE TRANSACTIONS ON COMPONENTS, HYBRIDS, AND MANUFACTURING TECHNOLOGY, Vol. CHMT-7, No. 4, pp. 423–428, Dec. 1984 disclose photoelectric conversion devices employing an array of a-Si:H photodiodes as shown in FIG. 1.

The a-Si:H photodiode shown in FIG. 1 is a Schottky barrier diode formed by superposing a metallic electrode 2 formed of Cr (chromium), an i- or p-type a-Si:H layer 3 and a transparent electrode 4 formed of ITO (indium tin oxide) in that order on an insulating substrate 1. In reading the image of a document by this photodiode, a power supply 5 maintains the transparent electrode 4 at a negative bias potential, and a driving circuit 6 maintains the metallic electrode 2 at a ground (or positive) bias potential. That is, in the conventional photoelectic conversion device using a-Si:H photodiodes, a bias voltage is applied across the metallic electrode 2 and the transparent electrode 4 so that the transparent electrode 4 is maintained at a negative bias potential relative to the metallic electrode 2. Accordingly, a Schottky barrier is formed in the interface between the a-Si:H layer and the transparent electrode 4, and the Schottky barrier functions as an electron blocking layer for making the interior of a light receiving part, namely, the a-Si:H layer, a depletion layer. This known photodiode advantageously requires a simple manufacturing process because only a single a-Si:H layer is necessary and any insulating film need not be formed between the a-Si:H layer 3 and the transparent electrode 4. However, the condition of the Schottky junction between the transparent electrode 4 and the a-Si:H layer 3 is greatly dependent on the composition and forming condition of ITO forming the transparent electrode 4, and the surface condition of the a-Si:H layer, and hence it is difficult to form a stable Schottky junction. Accordingly, it has been difficult to read the image of a document at a high S/N ratio with the photodiode by applying a bias voltage to the photodiode.

SUMMARY OF THE INVENTION

Accordingly, it is an object of the present invention to provide a high-performance photoelectric conversion device eliminating the foregoing drawbacks of the conventional photoelectric conversion device, suppressing dark current at a low level, and capable of achieving photoelectric conversion at a high S/N ratio.

To achieve the object of the invention, the present invention provides a photoelectric conversion device comprising: a photodiode consisting of a metallic electrode formed of a metal capable of forming a Schottky junction with amorphous silicon, a transparent electrode, and an intrinsic (i-type) a-Si:H layer sandwiched in between the metallic electrode and the transparent electrode; and means for applying a bias voltage across the metallic electrode and the transparent electrode to maintain the metallic electrode at a negative bias potential relative to the transparent electrode; wherein a Schottky barrier formed in the interface between the i type a-Si: H layer and the metallic electrode is used as an electron blocking layer.

Use of Cr, Ni or a Ni-Cr alloy for forming the metallic electrode reduces the manufacturing cost of the photoelectric conversion device, and these metals form a practically sufficiently effective Schottky barrier. Suitable materials for the transparent electrode are ITO, $SnO_2$ and ZnO. Desirably, the thickness of the i-type a-Si:H layer is in the range of 0.6 to 3 $\mu$m when the metallic electrode is formed of Cr, and is in the range of 1 to 3 $\mu$m when the metallic electrode is formed of Ni. The field dependency of photocurrent can be improved by doping the i-type a-Si:H layer with boron i the gaseous doping ratio $(B_2H_6)/(SiH_4)$ of 0.5 to 10 ppm.

When the present invention is applied to a linear image sensor, a plurality of metallic electrodes such as mentioned above are formed separately over a substrate, an a-Si:H layer is formed in the shape of a strip over the plurality of metallic electrodes, and then a transparent electrode such as mentioned above is formed in the shape of a strip over the a-Si:H layer to form a linear image sensor comprising an array of a plurality of photodiodes.

BRIEF DESCRIPTION OF THE DRAWINGS

The present invention will be described in detail with reference to the accompanying drawings, in which.

DESCRIPTION OF THE PREFERRED EMBODIMENTS

First Embodiment (FIGS. 2 to 6)

Figure 1:
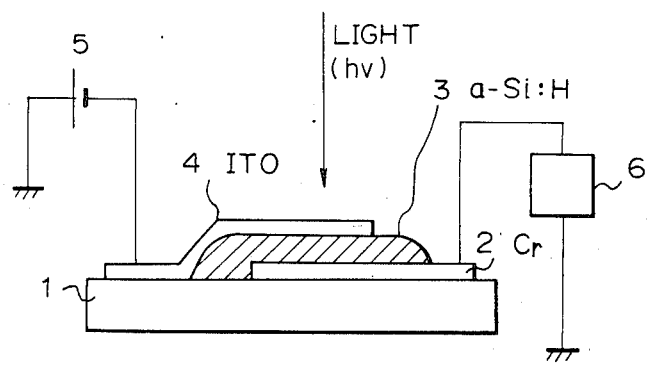
FIG. 1 is a sectional view of assistance in explaining the construction of a conventional photoelectric conversion device.
Figure 2:
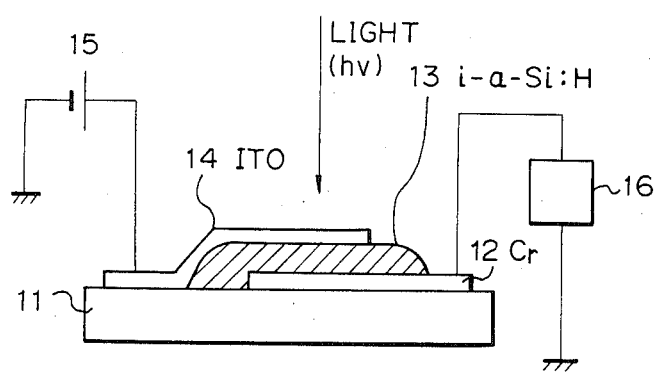
FIG. 2 is a sectional view of assistance in explaining the construction of a photoelectric conversion device, in a first embodiment, according to the present invention.

Referring to FIG. 2, a photoelectric conversion device comprises a photodiode having an insulating substrate 11, a lower metallic electrode 12 formed of Cr over the surface of the insulating substrate 11, an intrinsic (i-type) a-Si:H layer 13 formed over the lower metallic electrode 12, and an upper transparent electrode 14 formed of ITO over the a-Si:H layer 13; a power supply 15 for applying a positive bias potential to the upper transparent electrode 14; and a driving circuit 16 for applying a ground (or negative) bias potential to the lower metallic electrode 12. The photodiode is a Schottky barrier diode of the same construction as that of the photodiode shown in FIG. 1, however, the polarity of a bias voltage applied across the metallic electrode 12 and the transparent electrode 14 of the photodiode is inverse to that of the bias voltage for the photodiode of FIG. 1. In the photodiode employed in this embodiment shown in FIG. 2, the lower metallic electrode 12 is biased to a negative potential relative to the upper transparent electrode 14. Therefore, a Schottky barrier is formed in the interface between the lower metallic electrode 12 and the a-Si:H layer 13 and the Schottky barrier functions as an electron blocking layer for the photodiode.

Processes for fabricating the photodiode will be described hereinafter.

A Cr film is formed over the surface of the insulating substrate 11 by an evaporation process, and then the Cr film is etched by a photolithographic process in a predetermined pattern to form the lower metallic electrode 12. Then, the intrinsic a-Si:H layer 13 is formed over the lower metallic electrode 12 by a glow discharge process or a reactive sputtering process. Desirably, the thickness of the intrinsic a-Si:H layer 13 is in the range of 0.6 to 3 $\mu$m because of a reason which will be described afterward. Then, an ITO film is formed over the a-Si:H layer 13 by an evaporation process or a sputtering process, and then the ITO film is etched by a photolithographic process in a predetermined pattern to form the upper transparent electrode 14.

Figure 3:
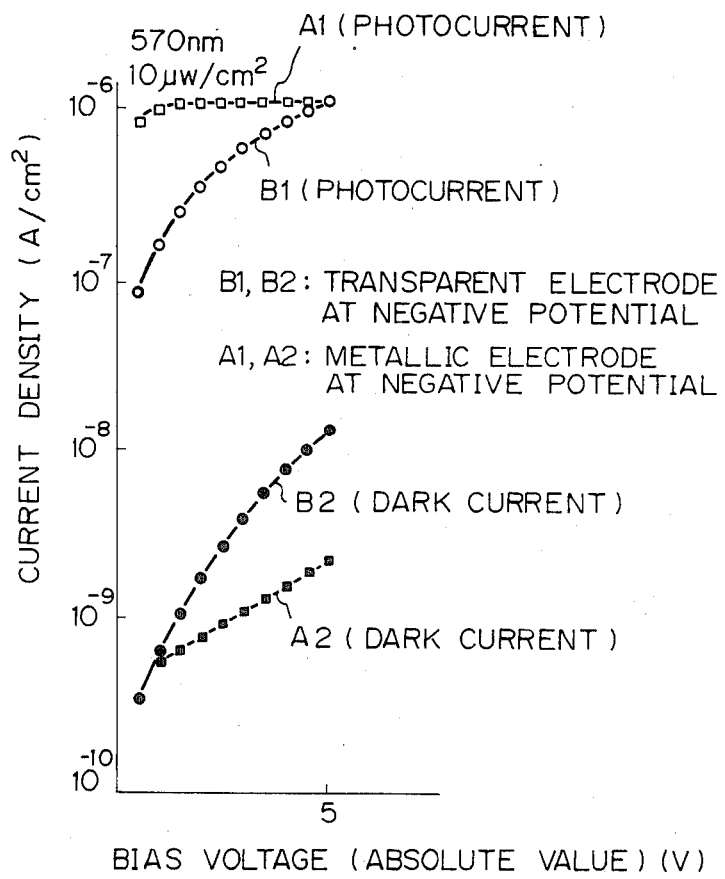
FIGS. 3 to 6 are graphs showing the characteristics of a photodiode employed in the photoelectric conversion device of FIG. 2.

FIG. 3 shows current-voltage characteristics of the photodiode when light of 570 nm in wavelength and 10 w/cm$^2$ in power was applied to the photodiode. Curves B1 and B2 indicate the current-voltage characteristics of the photodiode when the upper transparent electrode 14 is biased to a negative potential as in the conventional photoelectric conversion device, and curves A1 and A2 indicate the current-voltage characteristics of the same photodiode when the lower metallic electrode 12 is biased to a negative potential according to the present invention. The a-Si:H layer 13 is doped with boron in a (B$_2$H$_6$)/(SiH$_4$) ratio of 1 ppm. As obvious from FIG. 3, the order of the dark current for an applied voltage of 5 V when the lower metallic electrode 12 is biased to a negative potential (curve A2) is lower than that when the transparent electrode 14 is biased to a negative potential (curve B2) approximately by one order. When the lower metallic electrode 12 is biased to a negative potential (curve A1), the photocurrent reaches a saturation current at a voltage lower than a voltage at which the photocurrent reaches a saturation current when the upper transparent electrode 14 is biased to a negative potential (curve B1), which proves that biasing the lower metallic electrode 12 to a negative potential enables the photodiode to function in better current-voltage characteristics.

Figure 4:
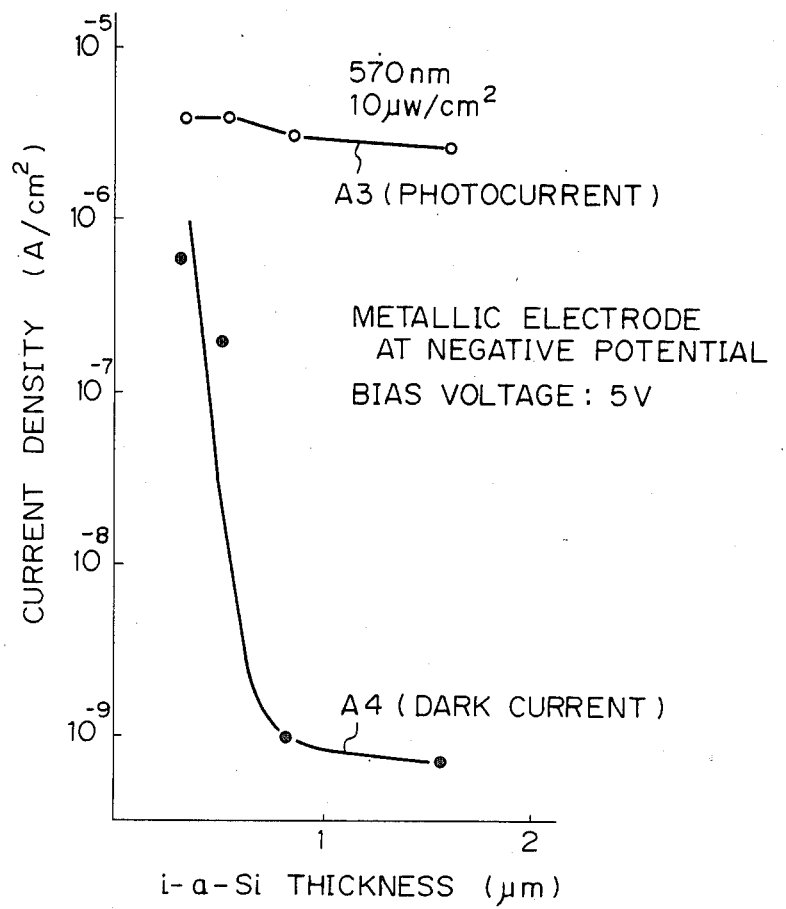

FIG. 4 shows the dependence of current on the thickness of the a-Si:H layer 13 when a bias voltage of 5 V is applied across the lower metallic electrode 12 and the upper transparent electrode 14 to bias the lower metallic electrode 12 to a negative potential relative to the upper transparent electrode 14, in which a curve A3 indicates the variation of photocurrent with the thickness of the a-Si:H layer 13, and a curve A4 indicates the variation of dark current with the thickness of the a-Si:H layer 13. When the thickness of the a-Si: H layer 13 is reduced below 0.8 $\mu$m, the dark current increases sharply and the photocurrent increases gradually, because a depletion layer on the side of the lower metallic electrode 12 expands to the upper transparent electrode 14 and the holes begin to inject into the a-S:H layer 13. Therefore, the desirable thickness of the a-Si:H layer 13 is greater than 0.8 $\mu$m. However, the dark current is at a satisfactorily low level even if the thickness of the a-Si:H layer 13 is about 0.6 $\mu$m.

On the other hand, when the thickness is excessively thick, the photocurrent reduces due to the reduction of drift length, and pinholes appear due to increase in the internal stress in the a-Si:H layer 13. Accordingly, from the practical point of view, the maximum thickness is approximately 3 $\mu$m.

Figure 5:
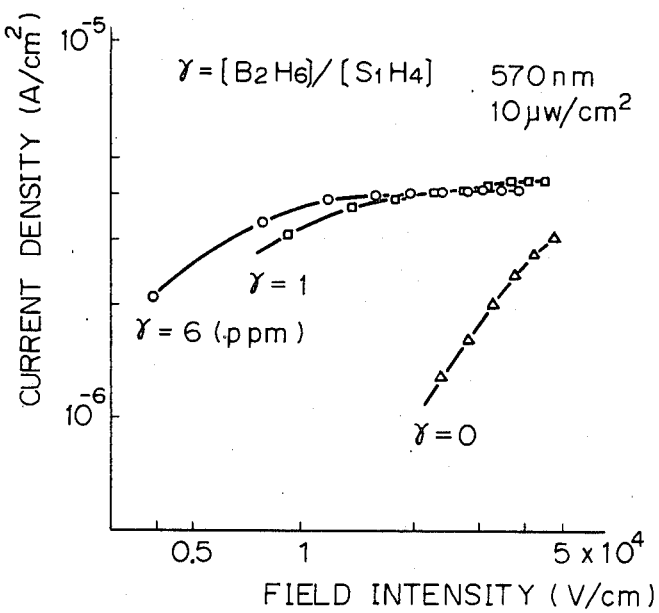
Figure 6:
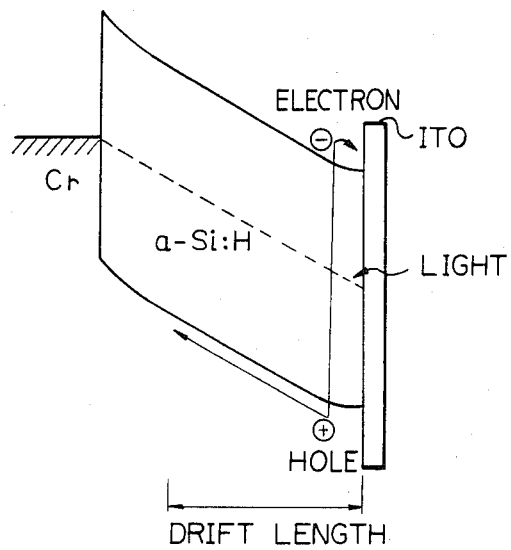

Doping the a-Si:H layer 13 with a small amount of boron improves the field dependency of the photocurrent. FIG. 5 shows the variation of photocurrent with field intensity for different boron doping ratio $\gamma = $(B$_2$H$_6$)/(SiH$_4$). The photocurrent reaches a saturation current at a lower field intensity for a greater boron doping ratio $\gamma$, because boron increases the drift length of holes (see FIG. 6). Increase in the boron doping ratio $\gamma$ beyond 10 ppm entails increase in the dark current reducing the S/N ratio, while the photocurrent does not reach a saturation current when the boron doping ratio $\gamma$ is below 0.5 ppm. Accordingly, a desirable boron doping ratio $\gamma$ is in the range of 0.5 to 10 ppm to improve the dependence of the photocurrent on field intensity.

Figure 7:
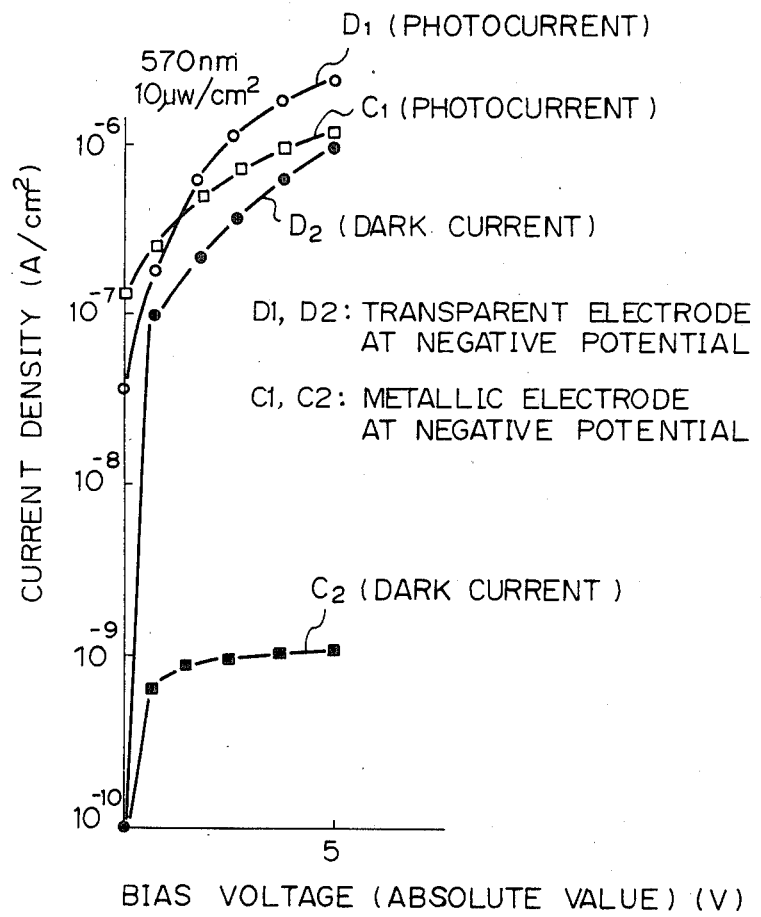
FIGS. 7 and 8 are graphs showing the characteristics of a photodiode employed in a photoelectric conversion device, in a second embodiment, according to the present invention.
Figure 8:
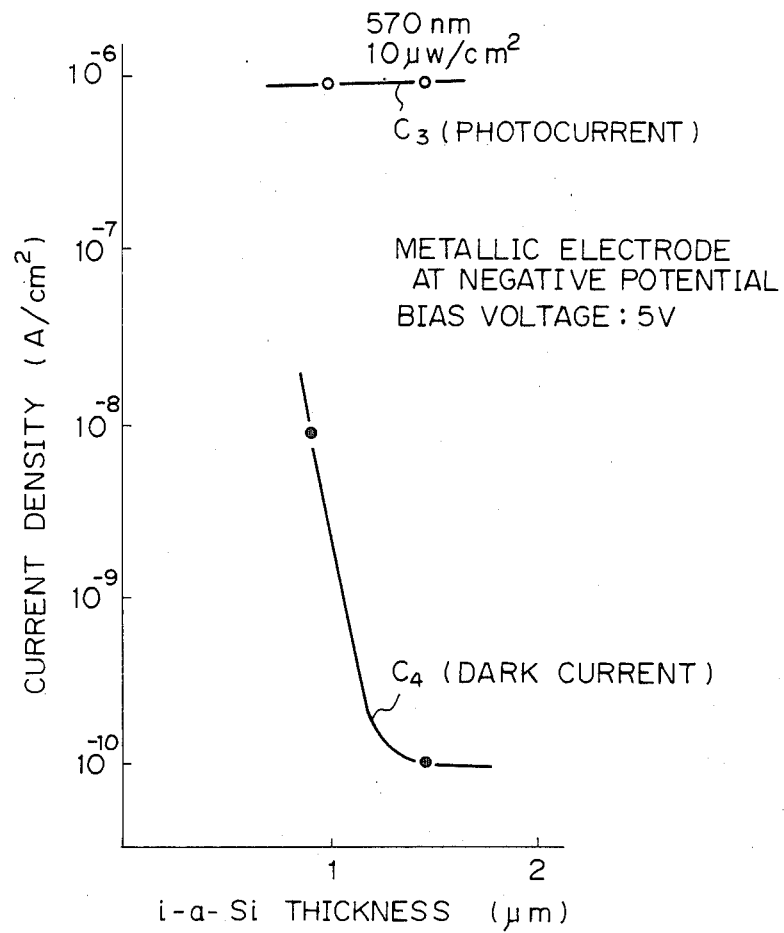

Second Embodiment (FIGS. 2, 7, 8)

The second embodiment is substantially the same as the first embodiment in construction except that the lower metallic electrode 12 of a photodiode employed in the second embodiment is formed of Ni (nickel) instead of Cr, and hence the second embodiment will be described also with reference to FIG. 2. The photodiode of the second embodiment comprises a substrate 11, the lower metallic electrode 12 formed of Ni over the surface of the substrate 11, an i-type a-Si:H layer 13 formed over the lower metallic electrode 12, and an upper transparent electrode 14 formed of ITO over the i-type a-Si:H layer 13. A bias voltage is applied across the lower metallic electrode 12 and the upper transparent electrode 14 so as to bias the lower metallic electrode 12 to a negative potential relative to the upper transparent electrode 14.

FIG. 7 shows current-voltage characteristics of the photodiode when light of 570 nm in wavelength and 10 w/cm$^2$ was applied to the photodiode, in which curves D1 and D2 indicate current-voltage characteristics when the upper transparent electrode 14 is biased to a negative potential as in the conventional photoelectric conversion device, and curves C1 and C2 indicate current-voltage characteristics when the lower metallic electrode 12 is biased to a negative potential according to the present invention. In the second embodiment, the a-Si:H layer 13 is not doped with boron. The dark current with a bias voltage of 5 V applied to the photodiode so as to bias the lower metallic electrode to a negative potential (curve C2) is smaller by three orders than that with the bias voltage applied to the photodiode so as to bias the upper transparent electrode 14 to a negative potential (curve D2). When the lower metallic electrode 12 is biased to a negative potential (curve C1), the photocurrent reaches a saturation current at a voltage lower than that at which the photocurrent reaches a saturation current when the upper transparent electrode is biased to a negative potential (curve D1), which proves that the photodiode functions in better characteristics when the lower metallic electrode 12 is biased to a negative potential.

FIG. 8 shows the dependence of current on the thickness of the a-Si:H layer 13 when a bias voltage of 5 V is applied, according to the present invention, across the lower metallic electrode 12 and the upper transparent electrode 14 so as to bias the lower metallic electrode 12 to a negative potential relative to the upper transparent electrode 14, in which curves C3 and C4 indicate the variation of the photocurrent with the thickness, and the variation of the dark current with the thickness, respectively. As obvious from FIG. 8, the dark current increases sharply when the thickness is reduced below 1.0 $\mu$m, because the depletion layer on the side of the lower metallic electrode 12 expands to the side of the upper electrode 14 and the holes begin to inject into the a-Si:H layer 13. Therefore, the desirable thickness of the a-Si:H layer 13 is approximately 1.0 $\mu$m or greater.

On the other hand, an excessively large thickness entails reduction in the photocurrent due to reduction in the drift length, and problems attributable to pinholes due to increase in the internal stress in the a-Si: H layer 13. Accordingly, from the practical point of view, the desirable thickness of the a-Si:H layer 13 is approximately 3 $\mu$m or below. In the second embodiment, similarly to the first embodiment, the dependence of the photocurrent on the field can be improved by doping the a-Si: H layer 13 with boron in a minute amount.

Third Embodiment (FIGS. 9 to 12)

The third embodiment is an application of the present invention to a linear image sensor. Referring to FIGS. 9 to 12, the linear image sensor comprises a photodiode array 26 having a plurality of photodiodes PDs, driving IC (integrated circuit) chips 31 having a shift register 27 and a plurality of CMOS (complementary metal oxide semiconductor) switches 28 respectively corresponding to the photodiodes PDs, each driving IC chip 31 adhesively attached respectively to a die bonding pad 29 by a conductive adhesive 30, a two-layer input/output wiring pattern 34 consisting of a Cr layer 32 and an Al layer 33, and an input/output terminal arrangement 35. The photodiode array 26 comprises a plurality of individual metallic electrodes 22 formed of Cr or Ni, an i-type a-Si:H layer 23 formed in the shape of a strip over one end of each individual metallic electrode 22, a transparent common electrode 24 formed of ITO in the shape of a strip over the i-type a-Si:H layer 23, and a protective layer 25 covering the individual metallic electrodes 22, the i-type a-Si:H layer 23 and the transparent common electrode 24. The terminals of the driving IC chip 31 are connected respectively to the individual metallic electrodes 22 and the input/output wiring pattern 34 by wire bonding. Each driving IC chip 31 is sealed in a resin mold 36.

Figure 9:
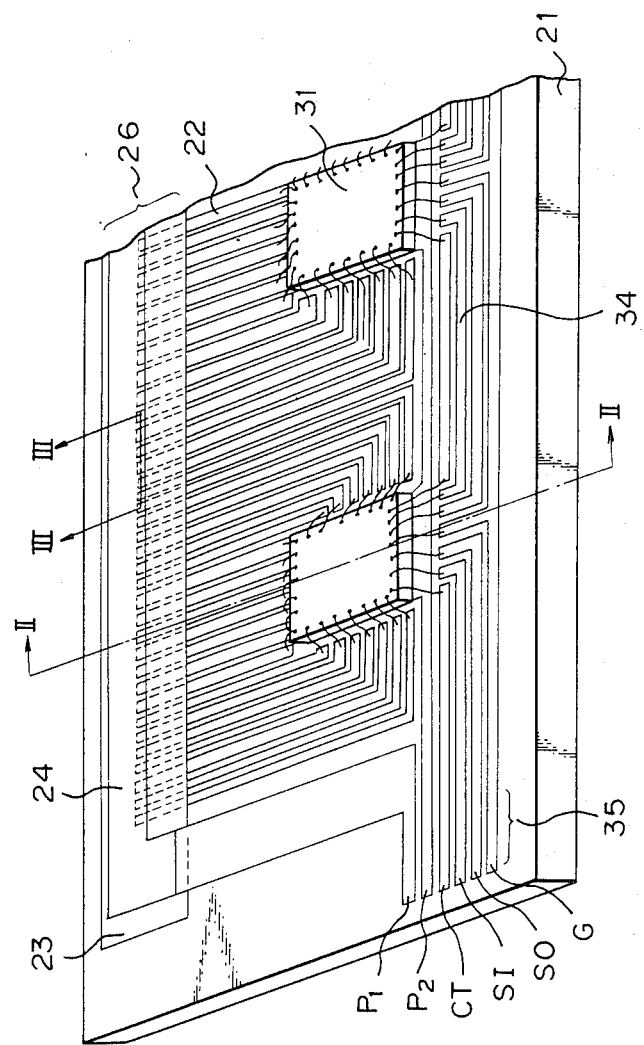
FIG. 9 is a fragmentary perspective view of a photoelectric conversion device, in a third embodiment, according to the present invention as applied to a linear image sensor.
Figure 10:
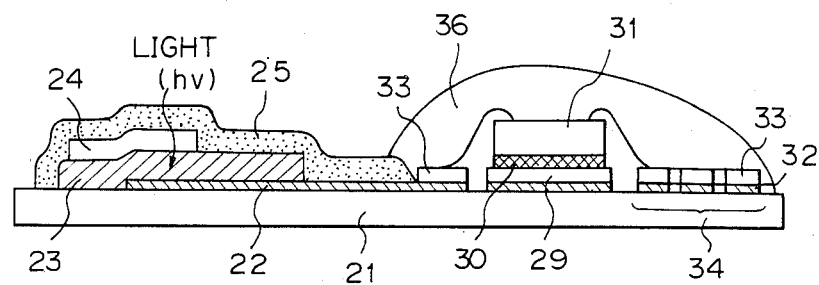
FIG. 10 is a sectional view taken on line II—II in FIG. 9.
Figure 11:
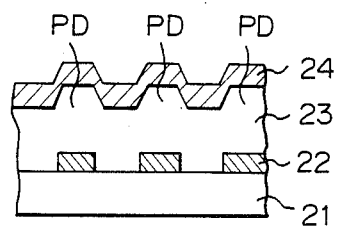
FIG. 11 is a sectional view taken on line III—III in FIG. 9.

The transparent common electrode 24 is connected through a power input terminal $P_1$ to the positive pole (for example, E= +5 V) of an external power source 37. Each driving IC chip 31 is connected through a power input terminal $P_2$ to the power source 37 to receive operating power ($V_{DD} = +5$ V), and through a grounding terminal G to an external ground. Each driving IC chip 31 receives clock signals through a clock terminal CT, and shift-in signals through a shift-in signal terminal SI from an external controller, not shown. The output terminal of each driving IC chip 31 is connected through a signal output terminal SO to an external load resistance $R_L$. The plurality of photodiodes PDs of the photodiode array 26 are arranged longitudinally, namely, along the scanning direction of the linear image sensor as shown in FIGS. 9 and 11.

Figure 12:
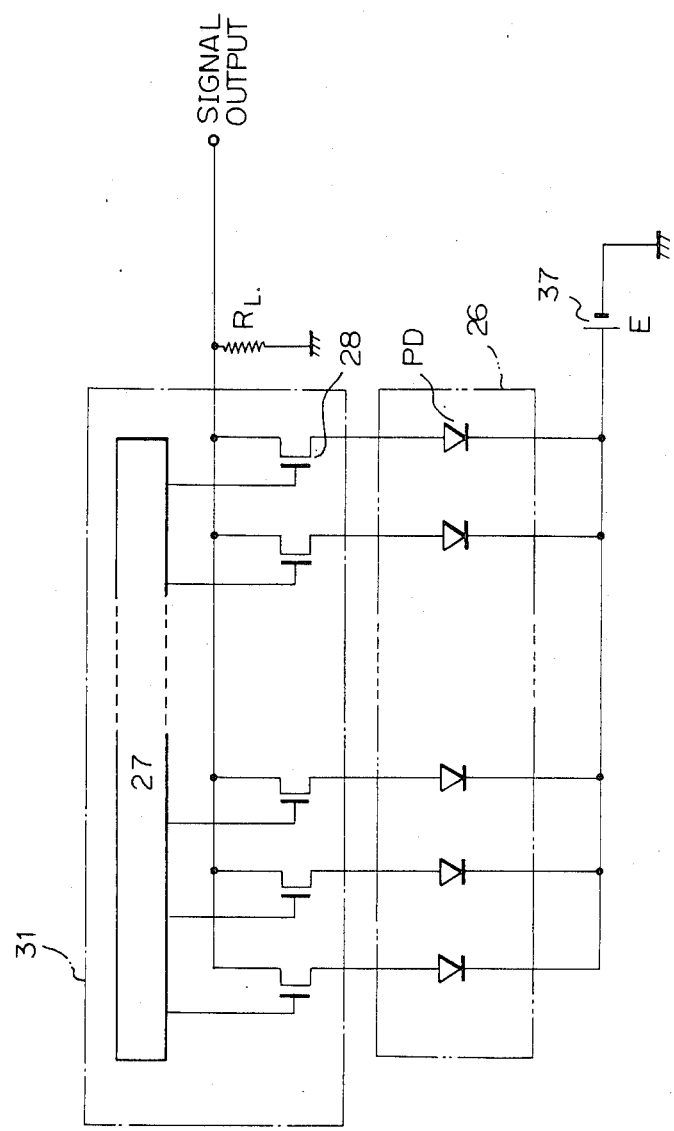
FIG. 12 is a circuit diagram showing an equivalent circuit of the photoelectric conversion device of FIG. 9.

The image reading operation of the linear image sensor will be described hereinafter with reference to FIG. 12.

The shift register 27 is driven before starting the image reading operation to turn on the CMOS switches 28 sequentially in order to ground the respective individual metallic electrodes 22 of the photodiodes PDs through the load resistor $R_L$, so that the individual metallic electrodes 22 are biased to a negative potential relative to the transparent common electrode 24. Consequently, the photodiodes PDs are charged at the supply voltage E. When light reflected by a document, namely, optical signals(hv), are applied to the charged photodiodes PDs, an electric charge of a quantity corresponding to the intensity of the each optical signal is generated in each photodiode and the photodiodes PDs are discharged. Then, the shift register 27 is driven again to turn on the CMOS switches 28 sequentially to charge the photodiodes PDs again at the supply voltage E. The charging currents are supplied sequentially as output signals through a common output line to the load resistance $R_L$ for detection.

In the foregoing embodiments, the lower metallic electrode of Cr or Ni, the a-Si:H layer and the upper transparent electrode are superposed in the order over the substrate. However, it is also possible to superpose the metallic electrode, the a-Si:H layer and the transparent electrode may be superposed in the reverse order on a transparent substrate. Furthermore, the metallic electrode, which is biased to a negative potential, may be formed of a Ni-Cr alloy, Pt, Au or Pd. The transparent electrode may be formed by other material, for example, $SnO_2$ or ZnO, other than ITO.

As apparent from the foregoing description, according to the present invention, a bias voltage is applied across the metallic electrode formed of Cr, Ni or a Ni-Cr alloy and transparent electrode formed of ITO or the like of a photodiode so as to bias the metallic electrode to a negative potential relative to the transparent electrode, and a Schottky barrier formed in the interface between the i-type a-Si:H layer and the metallic electrode is used as an electron blocking layer. Accordingly, the dark current is suppressed on a low level to provide a high-performance photoelectric conversion device capable of operating at a high S/N ratio.

Furthermore, since the metallic electrode is formed of Cr, Ni or a Ni-Cr alloy instead of an expensive metal such as Pt, Au or Pd, the photoelectric conversion device can be manufactured at a reduced manufacturing cost, and a practically satisfactory Schottky barrier can be formed in the photodiode.

While the invention has been described in detail and with reference to specific embodiments thereof, it will be apparent to one silled in the art that various changes and modifications can be made therein without departing from the spirit and scope thereof.

What is claimed is:

1. A photoelectric conversion device comprising:
   a photodiode comprising a metallic electrode formed of a metal capable of forming a Schottky junction together with amorphous silicon, a transparent electrode, and an i-type hydrogenated amorphous silicon layer sandwiched in between the metallic electrode and the transparent electrode; and
   bias voltage applying means for applying a bias voltage across the metallic electrode and the transparent electrode so as to bias the metallic electrode to a negative potential relative to the transparent electrode;
   wherein a Schottky barrier formed in the interface between the i-type hydrogenated amorphous silicon layer and the metallic electrode is used as an electron blocking layer.

2. A photoelectric conversion device according to claim 1, wherein said metallic electrode is formed of Cr, Ni or a Ni-Cr alloy, and said transparent electrode is formed of ITO, $SnO_2$ or ZnO.

3. A photoelectric conversion device according to claim 1, wherein said photodiode is formed on an insulating substrate.

4. A photoelectric conversion device according to claim 1, wherein said metallic electrode is formed of Cr, and thickness of said i-type hydrogenated amorphous silicon layer is in the range of 0.6 to 3 $\mu$m.

5. A photoelectric conversion device according to claim 1, wherein said metallic electrode is formed of Ni, and the thickness of said i-type hydrogenated amorphous silicon layer is in the range of 1 to 3 $\mu$m.

6. A photoelectric conversion device according to claim 1, wherein said i-type hydrogenated amorphous silicon layer is doped with boron in the gaseous doping ratio $(B_2H_6)/(SiH_4)$ of 0.5 to 10 ppm.

7. A photoelectric conversion device according to claim 3, wherein said metallic electrode is divided into a plurality of individual metallic electrodes so that said photodiode is equivalent to an array of a plurality of photodiodes.

* * * * *